United States Patent
Yu (10) Patent No.: US 9,467,985 B2
(45) Date of Patent: Oct. 11, 2016

(54) METHOD AND SYSTEM FOR TRANSMITTING DATA STREAM

(71) Applicant: Huawei Technologies Co., Ltd., Shenzhen, Guangdong (CN)

(72) Inventor: Rongdao Yu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 239 days.

(21) Appl. No.: 14/500,770

(22) Filed: Sep. 29, 2014

(65) Prior Publication Data

US 2015/0016343 A1    Jan. 15, 2015

Related U.S. Application Data

(63) Continuation of application No. PCT/CN2012/082972, filed on Oct. 15, 2012.

(30) Foreign Application Priority Data

Mar. 29, 2012    (CN) .......................... 2012 1 0088058

(51) Int. Cl.
*H03M 7/00* (2006.01)
*H04W 72/04* (2009.01)
(Continued)

(52) U.S. Cl.
CPC ........... *H04W 72/0413* (2013.01); *H03M 7/00* (2013.01); *H04B 7/0848* (2013.01); *H04L 1/00* (2013.01)

(58) Field of Classification Search
CPC ........ H01L 1/00; H04B 7/0848; H03M 7/00; H04W 72/04; H04W 72/0413
See application file for complete search history.

(56) References Cited

U.S. PATENT DOCUMENTS

2006/0008024 A1    1/2006   Wight
2010/0069010 A1*   3/2010   Karakayali ............ H04B 7/024
                                                          455/63.1
(Continued)

FOREIGN PATENT DOCUMENTS

CN    101232478 A    7/2008
CN    102377528 A    3/2012

OTHER PUBLICATIONS

Marsch et al., "Field Trial Results on Different Uplink Coordinated Multi-Point (CoMP) Concept in Cellular Systems," 2010 IEEE Global Telecommunications Conference, pp. 1-6, Institute of Electrical and Electronics Engineers, New York, New York (Dec. 6-10, 2010).

(Continued)

*Primary Examiner* — Afshawn Towfighi
*Assistant Examiner* — Lakeram Jangbahadur
(74) *Attorney, Agent, or Firm* — Leydig, Voit & Mayer, Ltd.

(57) ABSTRACT

Disclosed are a method and a system for transmitting a data stream, aiming at increasing system capacity. The method includes: transmitting, by a first sending end, a coded first data stream to a first receiving end, and transmitting, by a second sending end, a coded second data stream to a second receiving end on time-frequency resources occupied by transmission of the first data stream by the first sending end; decoding, by the first receiving end, a first received signal received to obtain a first decoded result, and transmitting at least one decoded result in the first decoded result to the second receiving end; and decoding, by the second receiving end, a second received signal received, by using the at least one decoded result in the first decoded result to obtain a second decoded result.

8 Claims, 4 Drawing Sheets

(51) Int. Cl.
*H04L 1/00* (2006.01)
*H04B 7/08* (2006.01)

(56) References Cited

U.S. PATENT DOCUMENTS

2011/0188478 A1* 8/2011 Elezabi ............... H04B 7/216
                                                370/335
2013/0148756 A1* 6/2013 Yu ..................... H04B 7/024
                                                375/267

OTHER PUBLICATIONS

Grieger et al., "Uplink Base Station Cooperation by Iterative Distributed Interference Subtraction," 2009 IEEE 20th International Symposium on Personal, Indoor and Mobile Radio Communications, pp. 1973-1977, Institute of Electrical and Electronics Engineers, New York, New York (Sep. 13-16, 2009).

Kim et al., "Optimization of Interference Alignment Beamforming Vectors," IEEE Journal on Selected Areas in Communications, pp. 1425-1434, Institute of Electrical and Electronics Engineers, New York, New York (Dec. 2010).

Dabora et al., "Relay Strategies for Interference-Forwarding," IEEE Information Theory Workshop, pp. 46-50, Institute of Electrical and Electronics Engineers, New York, New York (May 5-9, 2008).

Min et al., "Reliability Improvement Using Receive Mode Selection in the Device-to-Device Uplink Period Underlaying Cellular Networks," IEEE Transactions on Wireless Communications, pp. 413-418, vol. 10, Issue 2, Institute of Electrical and Electronics Engineers, New York, New York (Feb. 2011).

* cited by examiner

METHOD AND SYSTEM FOR TRANSMITTING DATA STREAM

CROSS-REFERENCE TO RELATED APPLICATIONS

This application is a continuation of International Patent Application No. PCT/CN2012/082972, filed on Oct. 15, 2012, which claims priority to Chinese Patent Application No. 201210088058.7, filed on Mar. 29, 2012, both of which are hereby incorporated by reference in their entireties.

TECHNICAL FIELD

The present invention relates to wireless communications, and more particularly, to a method and a system for transmitting a data stream.

BACKGROUND

D2D (Device-to-Device, device to device) communication technology is a novel technology allowing terminals (i.e., user equipment, which is hereinafter referred to as UE) to directly communicate with each other by multiplexing resources in a cell under control of a cellular system. In this way, control of a base station or an access node is not required, and thus communication or networking is quite flexible.

Introduction of a terminal self-organization communication mode (a D2D communication mode) for UEs of a cellular mobile communication system has a series of advantages. First, a local service for quite short distance may be completed by relaying among UEs directly without passing a base station, thereby reducing occupancy of resources of the base station. Second, a coverage flaw of a preset network can be made up, thereby eliminating some dead zones which always exist in a coverage area of an existing cellular mobile communication system. Third, power consumption can be reduced. Forth, due to the introduction of the terminal self-organization communication mode, capacity of the entire mobile communication system is increased.

Figure 1:
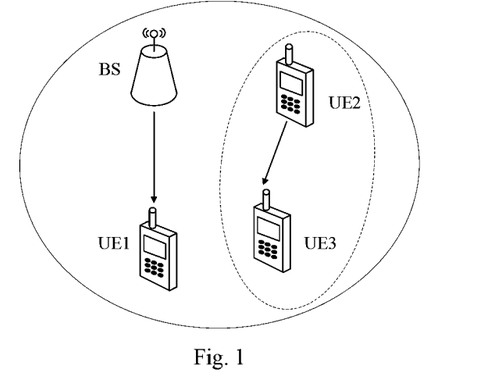
FIG. 1 is a schematic diagram of hybrid networking of a cellular network and D2D communication.
Figure 2:
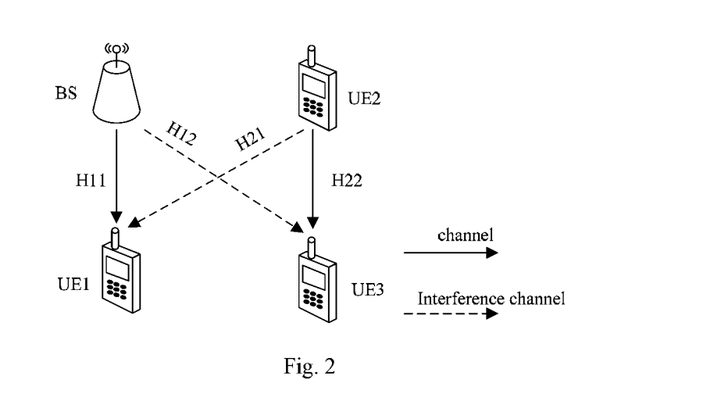
FIG. 2 is a schematic diagram of downlink transmission of data streams through D2D communication by multiplexing wireless resources of cellular communication.

With respect to a hybrid networking mode of a cellular network and D2D communication in the prior art, as shown in FIG. 1, a BS and UE1 perform transmission by the cellular network, and UE2 and UE3 perform transmission by means of D2D. It is illustrated by taking that the BS and the respective UEs are all configured with two antennas as an example. As shown in FIG. 2, the BS transmits downlink data steams $s_1$ and $s_2$ to the UE1 through the cellular network, wherein precoding vectors are $v_1$ and $v_2$; and the UE2 transmits data steam $s_3$ to the UE3 through D2D, wherein a precoding vector is $v_3$.

In this case, a signal $y_1$ received by the UE1 is as follows:

$$y_1 = H_{11}[\begin{matrix} v_1 & v_2 \end{matrix}]\begin{bmatrix} s_1 \\ s_2 \end{bmatrix} + H_{21}v_3 s_3$$

wherein $H_{11}$ is a channel from the BS to the UE1, and $H_{21}$ is an interference channel from the UE2 to the UE1.

A signal $y_2$ received by the UE3 is as follows:

$$y_2 = H_{12}[\begin{matrix} v_1 & v_2 \end{matrix}]\begin{bmatrix} s_1 \\ s_2 \end{bmatrix} + H_{22}v_3 s_3$$

wherein $H_{12}$ is an interference channel from the BS to the UE3, and $H_{22}$ is a channel from the UE2 to the UE3.

System capacity and spectral efficiency can be increased according to the above-mentioned method for transmitting a data stream, however, since the UE1 is configured with the two antennas, the UE1 can not decode the received signal y1 to obtain s1 and s2; and similarly, since the UE3 is configured with the two antennas, the UE3 can not decode the received signal y2 to obtain s3.

SUMMARY

The embodiments of the present invention provide a method and a system for transmitting a data stream, which are used for decoding a received signal to obtain data streams transmitted by a sending end as many as possible in the case that a receiving end is configured with a limited number of antennas and decoding can not be performed due to interference to a communication.

In one aspect, the present invention provides a method for transmitting a data stream, including:

transmitting, by a first sending end, a coded first data stream to a first receiving end, and transmitting, by a second sending end, a coded second data stream to a second receiving end on time-frequency resources occupied by transmission of the first data stream by the first sending end, wherein when the second sending end codes the second data stream, interference of at least one data stream in the second data stream to the first receiving end is correspondingly aligned with at least one data stream in the first data stream according to number of antenna(s) configured for the first receiving end;

decoding, by the first receiving end, a first received signal received to obtain a first decoded result, and transmitting at least one decoded result in the first decoded result to the second receiving end, wherein the first decoded result at least comprises sum data stream(s) of the above-mentioned correspondingly aligned data streams; and decoding, by the second receiving end, a second received signal received, by using the at least one decoded result in the first decoded result to obtain a second decoded result, wherein the second decoded result at least comprises the above-mentioned correspondingly aligned data streams.

In another aspect, the present invention provides a system for transmitting a data stream, including: a first sending end, a first receiving end, at least one second sending end and at least one second receiving end, wherein the first sending end is configured to transmit a coded first data stream to the first receiving end;

the second sending end is configured to transmit a coded second data stream to the second receiving end on time-frequency resources occupied by transmission of the first data stream by the first sending end, wherein when the second data stream is coded, interference of at least one data stream in the second data stream to the first receiving end is correspondingly aligned with at least one data stream in the first data stream according to number of antenna(s) configured for the first receiving end;

the first receiving end is configured to decode a first received signal received to obtain a first decoded result, and transmit at least one decoded result in the first decoded result to the second receiving end, wherein the first decoded result at least comprises sum data stream(s) of the above-mentioned correspondingly aligned data streams; and the second receiving end is configured to decode, a second received signal received, by using at least one decoded result in the first decoded result to obtain a second decoded result, wherein the second decoded result at least comprises the above-mentioned correspondingly aligned data streams.

The present invention provides a method and a system for transmitting a data stream, wherein the second sending end correspondingly aligns the interference of at least one data stream in the second data stream to the first receiving end with at least one data stream in the first data stream according to the number of antenna(s) configured for the first receiving end. In this way, the first decoded result of the first receiving end at least includes the sum data stream(s), and the second receiving end decodes by using at least one decoded result in the first decoded result to obtain the aligned data streams. Thus the aligned data streams are decoded by the second receiving end in the case that the first receiving end is configured with a limited number of antenna(s) and decoding can not be performed due to interference of the second data stream to the communication.

BRIEF DESCRIPTION OF DRAWINGS

In order to illustrate the technical solutions in the embodiments or in the prior art more clearly, a brief introduction will be made below on the drawings required in the description of the embodiments or the prior art. Obviously, the drawings described below are merely some embodiments of the present invention, based on which other drawings may also be obtained by persons of ordinary skill in the art without any inventive efforts.

DESCRIPTION OF EMBODIMENTS

The technical solution in the embodiments of the present invention will be described clearly hereinafter in conjunction with the drawings in the embodiments of the present invention. Apparently, the embodiments described are only a part, but not all, of the embodiments of the present invention. All other embodiments, which can be derived by the persons of ordinary skills in the art based on the embodiments of the present invention without any inventive efforts, fall into the protection scope of the present invention.

Figure 3:
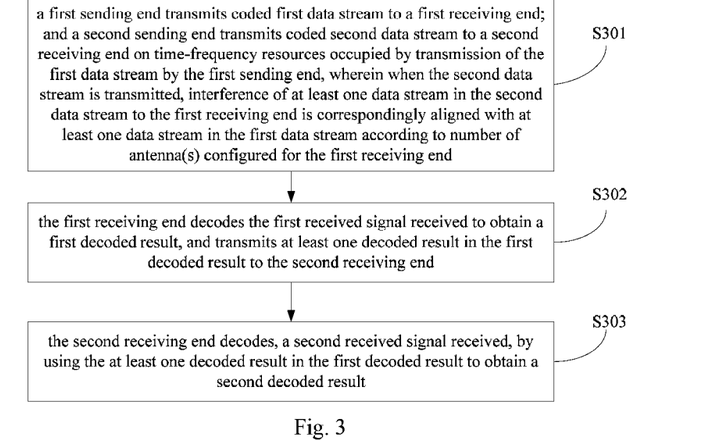
FIG. 3 is a flowchart of a method for transmitting a data stream provided by the present invention.
Figure 4:
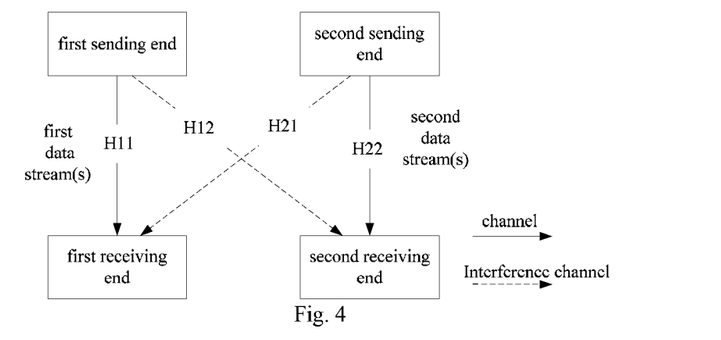
FIG. 4 is a schematic diagram of a data stream transmission based on the method shown in FIG. 3.

Referring to FIG. 3 and FIG. 4, the present invention provides a method for transmitting a data stream including the following steps.

S301, a first sending end transmits coded first data stream to a first receiving end, and a second sending end transmits coded second data stream to a second receiving end on time-frequency resources occupied by transmission of the first data stream by the first sending end, wherein when the second data stream is transmitted, interference of at least one data stream in the second data stream to the first receiving end is correspondingly aligned with at least one data stream in the first data stream according to number of antenna(s) configured for the first receiving end.

It should be noted that, in the embodiment of the present invention, the first data stream includes I (I≥1) data stream(s), and the second data stream includes J (J≥1) data stream(s).

In FIG. 4, $H_{11}$ represents a channel from the first sending end to the first receiving end, $H_{22}$ represents a channel from the second sending end to the second receiving end, $H_{12}$ represents an interference channel from the first sending end to the second receiving end, and $H_{21}$ represents an interference channel from the second sending end to the first receiving end.

In the embodiment of the present invention, in order to increase spectral efficiency, the second sending end transmits the coded second data stream to the second receiving end on the time-frequency resources occupied by transmission of the first data stream. That is to say, a communication between the second sending end and the second receiving end multiplexes wireless resources used by a communication between the first sending end and the first receiving end. However, a problem that the second data stream interferes with the transmission of the first data stream will be generated, and thus a first received signal received by the first receiving end includes not only the coded first data stream transmitted through the channel $H_{11}$ but also the coded second data stream transmitted through the interference channel $H_{21}$.

If the number of antenna(s) configured for the first sending end is m, the first received signal received by the first receiving end includes n number of data streams, and m is smaller than n, then the first receiving end can not perform decoding to obtain the data streams contained in the first received signal. Therefore, when the second receiving end transmits the coded second data stream, the interference of at least one data stream in the second data stream to the first receiving end is correspondingly aligned with at least one data stream in the first data stream, wherein the term "correspondingly" means a one-to-one correspondence between the at least one data stream in the second data stream and the at least one data stream in the first data stream, and the term "aligned" means that a product of a precoding vector of one data stream and a matrix of a channel for transmitting the data stream is equal to a product of a precoding vector of another data stream and a matrix of a channel for transmitting the another data stream. Specifically, interference of a $j^{th}$ data stream (hereinafter represented by $s_j$) in the second data stream to the first receiving end is aligned with an $i^{th}$ data stream (hereinafter represented by $s_i$) in the first data stream, wherein $1 \leq j \leq J$, and $1 \leq i \leq I$, and the alignment is represented by the following formula:

$$H_{11}v_i = H_{21}v_j;$$

wherein $v_i$ represents a precoding vector of the $i^{th}$ data stream in the first data stream, $v_j$ represents a precoding vector of the $j^{th}$ data stream in the second data stream, $H_{11}$ represents a matrix of a channel from the first sending end to the first receiving end, and $H_{21}$ represents a matrix of an interference channel from the second sending end to the first receiving end.

It should be noted that, in order for convenience of description, a same identification is used for a channel and a channel matrix in all the embodiments of the present invention. For example, $H_{11}$ not only represents a channel from the first sending end to the first receiving end, but also represents a matrix of the channel.

Upon each alignment of the interference of one data stream in the second data stream to the first receiving end with one data stream in the first data stream, the number of unknown data streams in the first received signal received by the first receiving end may be reduced by one. In the embodiment of the present invention, the interference of at least one data stream in the second data stream to the first receiving end is correspondingly aligned with at least one data stream in the first data stream according to the number of antenna(s) configured for the first receiving end, so that the number of unknown data streams in the first received signal is less than or equal to the number of antenna(s) configured for the first receiving end, and thus the first receiving end may perform decoding to obtain all the unknown data stream(s) in the first received signal, wherein the unknown data stream(s) in the first received signal at least includes: sum data stream(s) of the above-mentioned correspondingly aligned data streams, that is, at least includes a sum data stream $s_j+s_i$. If there is an unaligned data stream in the first data stream, the unknown data stream(s) in the first received signal may further include the unaligned data stream.

S302, the first receiving end decodes the first received signal received to obtain a first decoded result, and transmits at least one decoded result in the first decoded result to the second receiving end.

Through the corresponding alignment process in the step S301, the number of unknown data stream(s) in the first received signal is less than or equal to the number of antenna(s) configured for the first receiving end. In this case, the first receiving end can decode all the unknown data stream(s) in the first received signal to obtain the first decoded result. That is, the first decoded result at least includes sum data stream(s) of the correspondingly aligned data streams, or further includes an unaligned data stream in the first data stream.

Preferably, the step of transmitting at least one decoded result in the first decoded result to the second receiving end includes: the first receiving end transmits at least one decoded result in the first decoded result to the second receiving end by D2D communication. Further preferably, as there are relatively less uplink services according to symmetry of uplink spectra and downlink spectra of FDD (Frequency Division Duplexing, frequency division duplexing) and asymmetry of services, the first receiving end transmits at least one decoded result in the first decoded result to the second receiving end by using uplink spectrum resources.

S303, the second receiving end decodes, a second received signal received by the second receiving end, by using the at least one decoded result in the first decoded result to obtain a second decoded result, wherein the second decoded result includes the above-mentioned correspondingly aligned data streams.

If the first decoded result only includes the sum data stream(s) of the above-mentioned correspondingly aligned data streams, the above-mentioned at least one decoded result in the first decoded result indicates at least one sum data stream.

If the first decoded result further includes an unaligned data stream in the first data stream, the above-mentioned at least one decoded result in the first decoded result indicates at least one of: the unaligned data stream in the first data stream and sum stream(s) of the above-mentioned correspondingly aligned data streams.

The present invention provides a method for transmitting a data stream, wherein the second sending end correspondingly aligns the interference of at least one data stream in the second data stream to the first receiving end with at least one data stream in the first data stream according to the number of antenna(s) configured for the first receiving end. In this way, the first decoded result of the first receiving end at least includes sum data stream(s), and the second receiving end can perform decoding by using the at least one decoded result in the first decoded result to obtain the aligned data streams. Thus the aligned data streams are obtained by the second receiving end through decoding in the case that the first receiving end is configured with a limited number of antenna(s) and decoding can not be performed due to communication being interfered by the second data stream.

Figure 5:
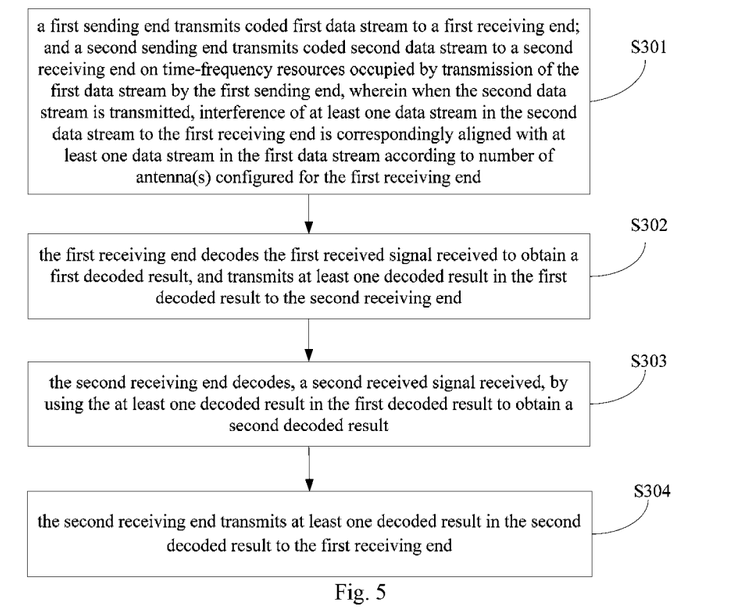
FIG. 5 is a flowchart of another method for transmitting a data stream provided by the present invention.

Further, referring to FIG. 5, the above-mentioned method may further include S304.

S304, the second receiving end transmits at least one decoded result in the second decoded result to the first receiving end according to need of the first receiving end.

Through the step S304, the first receiving end can acquire every needed data stream thereof.

Hereinafter, an embodiment of the present invention provides a method for transmitting a data stream regarding the scenario of downlink data transmission shown in FIG. 2. In the present specific embodiment, the above-mentioned first sending end, first receiving end, second sending end and second receiving end respectively are BS, UE1, UE2 and UE3, and it is illustrated by taking that all of the BS, UE1, UE2 and UE3 are configured with two antennas as an example. The above-mentioned first data stream includes two data streams $s_1$ and $s_2$, and the above-mentioned second data stream includes a data stream $s_3$. $H_{11}$ is a channel from the BS to the UE1, $H_{21}$ is an interference channel from the UE2 to the UE1, $H_{12}$ is an interference channel from the BS to the UE3, and $H_{22}$ is a channel from the UE2 to the UE3.

Step 1, the BS transmits the data streams $s_1$ and $s_2$ to the UE1 by downlink cellular transmission, wherein the precoding vectors of the two data streams are $v_1$ and $v_2$ respectively; and the UE2 transmits the data stream $s_3$ to the UE3 on time-frequency resources occupied by transmission of the data streams $s_1$ and $s_2$ from the BS to the UE1, wherein the precoding vector of the data stream $s_3$ is $v_3$.

When $s_3$ is transmitted, the interference of $s_3$ to the UE1 is aligned with $s_2$ (or with $s_1$, and $s_2$ is taken as an example in the present specific embodiment), i.e., let $H_{11}v_2=H_{21}v_3$. That is to say, the precoding vector $v_2$ for coding $s_2$ by the BS2 and the precoding vector $v_3$ for coding $s_3$ by the UE2 need to satisfy the formula.

Step 2, the UE1 receives a first received signal, performs decoding to obtain a first decoded result, and transmits at least one decoded result of the first decoded result to the UE2.

The first received signal is $y_1$:

$$y_1=H_{11}v_1s_1+H_{21}v_3(s_2+s_3)$$

The above-mentioned first received signal $y_1$ includes two unknown data streams: $s_1$ and $(s_2+s_3)$. Since the UE1 is configured with two antennas, the UE1 can decode all of the two unknown data streams, that is, the first decoded result includes: $s_1$ and $(s_2+s_3)$. The UE1 may transmit at least one decoded result in the first decoded result to the UE2, and in the present specific embodiment, transmitting $s_1$ in the first decoded result from the UE1 to the UE2 is taken as an example. Preferably, the UE1 transmits $s_1$ to the UE3 by using uplink spectra through D2D.

Step 3, the UE3 receives a second received signal, and decodes, the second received signal received by the UE3, by using $s_1$ to obtain a second decoded result.

The second received signal is $y_2$:

$$y_2 = H_{12}[\begin{array}{cc} v_1 & v_2 \end{array}]\begin{bmatrix} s_1 \\ s_2 \end{bmatrix} + H_{22}v_3 s_3$$

In this case, since $s_1$ is known, the second received signal $y_2$ only includes two unknown data streams, i.e., $s_2$ and $s_3$, and since the UE3 is configured with two antennas, the UE3 may perform decoding to obtain $s_2$ and $s_3$, that is, the second decoded result includes $s_2$ and $s_3$.

Obviously, according to the method provided by the present invention, in the case that the UE1 is configured with a limited number of antennas, the number of the unknown data streams in the first received signal can be reduced by aligning the interference of $s_3$ to the UE1 with $s_2$, so that the UE1 can perform decoding to obtain all the unknown data streams.

If only $s_1$ in the data streams transmitted from the BS to the UE1 is the data stream needed by the UE1, the data stream transmission is ended.

If both $s_1$ and $s_2$ in the data streams transmitted from the BS to the UE1 are the data streams needed by the UE1, the above-mentioned specific embodiment may further include:

Step 4, the UE3 transmits at least one decoded result in the second decoded result to the UE1.

Specifically, the UE3 may directly transmit $s_2$ to the UE1; or transmit $s_3$ to the UE1, so that the UE1 may solve $s_2$ by combining $(s_2+s_3)$; or transmit both $s_2$ and $s_3$ to the UE1.

Regarding the scenario of downlink data transmission shown in FIG. 2, the present invention further provides a method for transmitting a data stream. In the present specific embodiment, the above-mentioned first sending end, first receiving end, second sending end and second receiving end respectively are BS, UE1, UE2 and UE3, and it is illustrated by taking that all of the BS, UE1, UE2 and UE3 are configured with two antennas as an example. The above-mentioned first data stream includes two data streams $s_1$ and $s_2$, and the above-mentioned second data stream includes data streams $s_3$ and $s_4$. $H_{11}$ is a channel from the BS to the UE1, $H_{21}$ is an interference channel from the UE2 to the UE1, $H_{12}$ is an interference channel from the BS to the UE3, and $H_{22}$ is a channel from the UE2 to the UE3.

Step 1, the BS transmits the data streams $s_1$ and $s_2$ to the UE1 by downlink cellular transmission, wherein the precoding vectors of the two data streams are $v_1$ and $v_2$ respectively; and the UE2 transmits the data streams $s_3$ and $s_4$ to the UE3 on on time-frequency resources occupied by transmission of the data streams $s_1$ and $s_2$ from the BS to the UE1, wherein the precoding vectors of the data streams $s_3$ and $s_4$ are $v_3$ and $v_4$.

When $s_3$ and $s_4$ are transmitted, the interference of $s_3$ to the UE1 is aligned with $s_2$, that is, let $H_{11}v_2=H_{21}v_3$, and the interference of $s_4$ to the UE1 is aligned with $s_1$, that is, let $H_{11}v_1=H_{21}v_4$.

Step 2, the UE1 receives a first received signal, performs decoding to obtain a first decoded result, and transmits at least one decoded result of the first decoded result to the UE2.

The first received signal is $y_1$:

$$y_1 = H_{11}v_1(s_1+s_4)+H_{21}v_3(s_2+s_3)$$

The above-mentioned first received signal $y_1$ includes two unknown data streams: $(s_1+s_4)$ and $(s_2+s_3)$. Since the UE1 is configured with two antennas, the UE1 can decode all of the two unknown data streams. That is, the first decoded result includes $(s_1+s_4)$ and $(s_2+s_3)$. The UE1 may transmit at least one decoded result in the first decoded result to the UE2, and in the present specific embodiment, the UE1 preferably transmits $(s_1+s_4)$ and $(s_2+s_3)$ in the first decoded result to the UE2, so that the UE2 may perform decoding to obtain all the unknown data streams in the second received signal. Preferably, the UE1 transmits $(s_1+s_4)$ and $(s_2+s_3)$ to the UE3 by using uplink spectra through D2D.

Step 3, the UE3 receives a second received signal, and decodes, the second received signal received by the UE3, by using $(s_1+s_4)$ to obtain a second decoded result.

The second received signal is $y_2$:

$$y_2 = H_{12}[\begin{array}{cc} v_1 & v_2 \end{array}]\begin{bmatrix} s_1 \\ s_2 \end{bmatrix} + H_{22}[\begin{array}{cc} v_3 & v_4 \end{array}]\begin{bmatrix} s_3 \\ s_4 \end{bmatrix}$$

In this case, since $(s_1+s_4)$ and $(s_2+s_3)$ are known, two unknown data streams in the second received signal $y_2$ may be represented by another two unknown data streams, for example, $s_3=(s_2+s_3)-s_2$, $s_4=(s_1+s_4)-s_1$. In this case, only two unknown data streams $s_1$ and $s_2$ are left in the above-mentioned second received signal. Since the UE3 is configured with two antennas, the UE3 may perform decoding to obtain $s_1$ and $s_2$, and may further decode to obtain $s_3$ and $s_4$. That is, the second decoded result includes $s_1$, $s_2$, $s_3$ and $s_4$.

Obviously, according to the method provided by the present invention, in the case that the UE1 is configured with a limited number of antennas, the number of the unknown data streams in the first received signal can be reduced by aligning the interference of $s_3$ to the UE1 with $s_2$, so that the UE1 can perform decoding to obtain all the unknown data streams.

Further, the above-mentioned specific embodiment may further include:

Step 4, the UE3 transmits at least one decoded result of the second decoded result to the UE1 according to need of the UE1.

Specifically, if only $s_1$ in the first data stream transmitted from the BS to the UE1 is the data stream needed by the UE1, the UE3 may transmit $s_1$ or $s_4$ to the UE1, so that the UE1 finally acquires $s_1$. Certainly, besides $s_1$ or $s_4$, the UE3 may also transmit other data stream(s) in the second decoded result to the UE1.

Similarly, if only $s_2$ in the first data stream transmitted from the BS to the UE1 is the data stream needed by the UE1, the UE3 may transmit $s_2$ or $s_3$ to the UE1, so that the UE1 finally acquires $s_2$. Of course, besides $s_2$ or $s_3$, the UE3 may also transmit other data stream(s) in the second decoded results to the UE1.

If both $s_1$ and $s_2$ in the first data stream transmitted from the BS to the UE1 are the data streams needed by the UE1, the UE3 transmits $s_1$ and $s_2$, or transmits $s_1$ and $s_3$, or transmits $s_2$ and $s_4$, or transmits $s_3$ and $s_4$ to the UE1, so that the UE1 may finally acquire $s_1$ and $s_2$.

The embodiment of the present invention further provides a system for transmitting a data stream corresponding to the above-mentioned method. For description of functionalities of respective devices in the system, reference may be made to the description of the steps in the above-mentioned method, which is not omitted herein.

Figure 6:
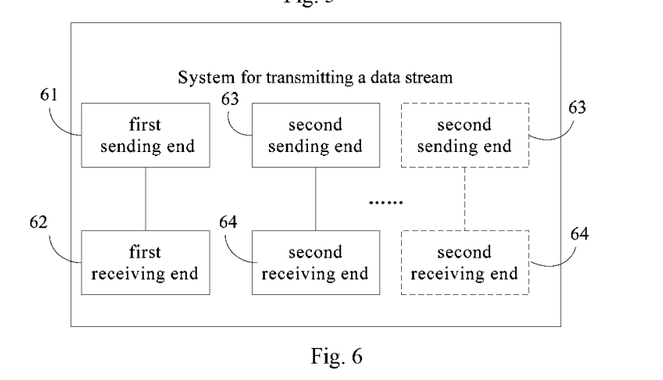
FIG. 6 is a schematic diagram of a system for transmitting a data stream provided by the present invention.

As shown in FIG. 6, the system for transmitting a data stream provided by an embodiment of the present invention includes: a first sending end 61, a first receiving end 62, at least one second sending end 63 and at least one second receiving end 64, wherein the first sending end 61 is configured to transmit a coded first data stream to the first receiving end;

the second sending end 63 is configured to transmit a coded second data stream to the second receiving end on time-frequency resources occupied by transmission of the first data stream by the first sending end, wherein when the second data stream is coded, interference of at least one data stream in the second data stream to the first receiving end is correspondingly aligned with at least one data stream in the first data stream according to number of antenna(s) configured for the first receiving end;

the first receiving end 62 is configured to decode a first received signal received to obtain a first decoded result, and transmit at least one decoded result in the first decoded result to the second receiving end, wherein the first decoded result at least comprises sum data stream(s) of the above-mentioned correspondingly aligned data streams; and the second receiving end 64 is configured to decode, a second received signal received, by using at least one decoded result in the first decoded result to obtain a second decoded result, wherein the second decoded result at least comprises the above-mentioned correspondingly aligned data streams.

Preferably, the second receiving end 64 is further configured to transmit at least one decoded result in the second decoded result to the first receiving end.

Preferably, the first receiving end 62 is further configured to decode the first received signal received to obtain the first decoded result, and transmit the at least one decoded result in the first decoded result to the second receiving end by device-to-device (D2D) communication.

Further preferably, the first receiving end 62 is further configured to decode the first received signal received to obtain the first decoded result, and transmit the at least one decoded result in the first decoded result to the second receiving end by using uplink spectrum resources.

The present invention provides a system for transmitting a data stream, wherein the second sending end correspondingly aligns the interference of at least one data stream in the second data stream to the first receiving end with at least one data stream in the first data stream according to the number of antenna(s) configured for the first receiving end. In this way, the first decoded result of the first receiving end at least includes the sum data stream(s), and the second receiving end decodes by using at least one decoded result in the first decoded result to obtain the aligned data streams. Thus the aligned data streams are decoded by the second receiving end in the case that the first receiving end is configured with a limited number of antenna(s) and decoding can not be performed due to interference of the second data stream to communication.

Figure 7:
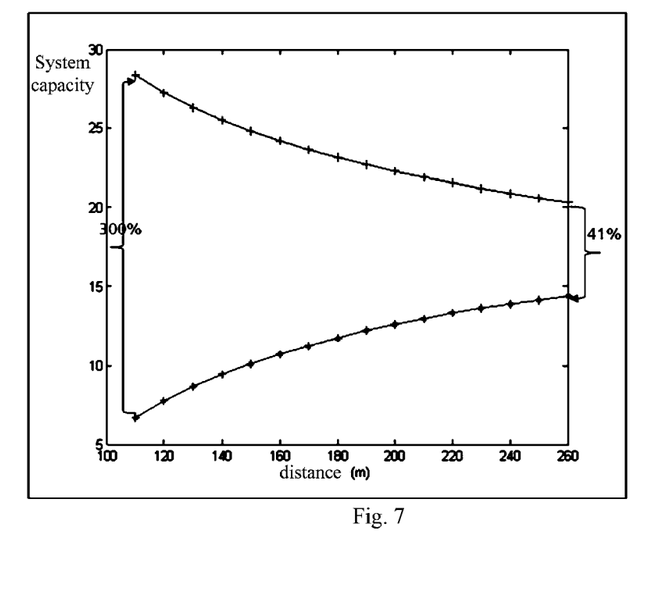
FIG. 7 is a diagram of simulation results of a method for transmitting a data stream provided by the present invention.

FIG. 7 is a diagram of simulation results of a method for transmitting a data stream provided by the present invention. A horizontal axis represents a distance from UE to a base station, wherein the UE moves from a centre of a cell (100 m away from the base station) towards an edge of the cell, until arriving at a position 260 m away from the base station. A vertical axis represents system capacity. In FIG. 7, an upper line is a result curve corresponding to the solution of the present invention, and a lower line is a result curve corresponding to the solution of the prior art.

Since interference will be generated in case of multiplexing wireless resources, if number of antenna(s) configured for a receiving end is less than number of unknown data streams in a received signal, the receiving end can not decode the received signal. That is to say, in the prior art, it is necessary to control the amount of wireless resources being multiplexed to a certain extent, so as to ensure that the receiving end is capable of decoding the received signal. By using the method provided by the embodiment of the present invention, the receiving end is capable of decoding more unknown data streams in the received signal while keeping the number of the existing configured antenna(s) unchanged. That is to say, under a condition of existing system configuration, system capacity increases with increasing of the amount of supported wireless resources being multiplexed. It can be seen from FIG. 3 that, at a position of 100 m away from the base station, the system capacity according to the solution provided by the present invention has a 300% gain with respect to an existing method for transmitting a data stream; and at a position of 260 m away from the base station, system capacity according to the solution provided by the present invention has a 41% gain with respect to the existing method for transmitting a data stream.

It may be recognized by those of ordinary skill in the art that all or part of steps for realizing the above-mentioned embodiment of the method may be implemented with program instructing an associated hardware. The foregoing program may be stored in a computer readable storage medium, and when being executed, the program executes the steps including the ones in the above-mentioned embodiment of the method. The foregoing storage medium includes various media capable of storing program codes, such as an ROM, an RAM, a disk, an optical disk or the like.

The foregoing descriptions are merely specific implementations of the present invention, rather than limiting the protection scope of the invention. Any change or substitution, which is readily conceived for any one skilled in the art within the technical scope disclosed by the invention, shall fall into the protection scope of the invention. Therefore, the protection scope of the present invention shall be defined by the claims.

What is claimed is:

1. A method for transmitting a data stream, comprising:

transmitting, by a first sending device, a coded first data stream to a first receiving device, and transmitting, by a second sending device, a coded second data stream to a second receiving device on time-frequency resources occupied by transmission of the first data stream by the first sending device, wherein the second sending device codes the second data stream to enable interference of at least one data stream in the second data stream to the first receiving device to be correspondingly aligned with at least one data stream in the first data stream according to a number of antennas configured for the first receiving device;

decoding, by the first receiving device, a first received signal to obtain a first decoded result, and transmitting at least one decoded result in the first decoded result to the second receiving device, wherein the first decoded result comprises at least sum data streams of said correspondingly aligned data streams; and decoding, by the second receiving device, a second received signal, using the at least one decoded result in the first decoded result to obtain a second decoded result, wherein the second decoded result comprises at least said correspondingly aligned data streams.

2. The method of claim 1, further comprising: transmitting, by the second receiving device, at least one decoded result in the second decoded result to the first receiving device.

3. The method of claim 1, wherein the transmitting at least one decoded result in the first decoded result to the second receiving device, comprises: transmitting, by the first receiving device, at least one decoded result in the first decoded result to the second receiving device using a device-to-device (D2D) communication.

4. The method of claim 3, wherein the transmitting at least one decoded result in the first decoded result to the second receiving device, comprises: transmitting, by the first receiving device, at least one decoded result in the first decoded result to the second receiving device using uplink spectrum resources.

5. A system for transmitting a data stream, comprising:
a first sending device, a first receiving device, at least one second sending device and at least one second receiving device, wherein
the first sending device is configured to transmit a coded first data stream to the first receiving device;
the second sending device is configured to transmit a coded second data stream to the second receiving device on time-frequency resources occupied by transmission of the first data stream by the first sending device, wherein the second data stream is coded to enable interference of at least one data stream in the second data stream to the first receiving device to be correspondingly aligned with at least one data stream in the first data stream according to a number of antennas configured for the first receiving device;
the first receiving device is configured to decode a first received signal to obtain a first decoded result, and transmit at least one decoded result in the first decoded result to the second receiving device, wherein the first decoded result comprises at least sum data streams of said correspondingly aligned data streams; and
the second receiving device is configured to decode, a second received signal, using at least one decoded result in the first decoded result to obtain a second decoded result, wherein the second decoded result comprises at least said correspondingly aligned data streams.

6. The system of claim 5, wherein the second receiving device is further configured to transmit at least one decoded result in the second decoded result to the first receiving device.

7. The system of claim 5, wherein the first receiving device is further configured to decode the first received signal to obtain the first decoded result, and transmit the at least one decoded result in the first decoded result to the second receiving device using a device-to-device (D2D) communication.

8. The system of claim 7, wherein the first receiving device is further configured to decode the first received signal to obtain the first decoded result, and transmit the at least one decoded result in the first decoded result to the second receiving device using uplink spectrum resources.

* * * * *